United States Patent [19]

Charles

[11] Patent Number: 4,469,637

[45] Date of Patent: Sep. 4, 1984

[54] ELECTRO CONDUCTIVE POLYMER COMPOSITIONS AND NEW MATERIALS FOUND USEFUL IN THEIR PREPARATION

[75] Inventor: Harold Charles, West Milford, N.J.

[73] Assignee: Trakka Corporation, West Mildord, N.J.

[21] Appl. No.: 468,773

[22] Filed: Feb. 22, 1983

Related U.S. Application Data

[62] Division of Ser. No. 186,421, Sep. 12, 1980.

[51] Int. Cl.$^3$ ............................................... C07F 7/00
[52] U.S. Cl. ............................. 260/429.3; 252/518; 252/520
[58] Field of Search .............. 252/511, 512, 518, 520, 252/506, 507; 260/429.3, 429.5, 448

[56] References Cited

U.S. PATENT DOCUMENTS

| | | | |
|---|---|---|---|
| 4,069,192 | 1/1978 | Monte et al. | 260/429.5 |
| 4,087,402 | 5/1978 | Monte et al. | 260/429.5 |
| 4,207,245 | 6/1980 | Halbert | 260/429.5 |
| 4,235,990 | 11/1980 | DiGracomo et al. | 260/929.5 |

Primary Examiner—Josephine L. Barr
Attorney, Agent, or Firm—Ronald G. Goebel

[57] ABSTRACT

Preparation of new, useful and novel highly electroconductive polymer compositions via the dispersion of electrically particulates in conjunction with small proportions of certain organo aluminates, titanates and/or zirconates in polymeric substrates is hereinafter described. Further the production of heretofore unknown classes of organo aluminates, titanates and zirconates useful in the practice of this invention is disclosed and generically useful subclasses of these compounds defined. Advantages other than improved electrical conductivity of the resultant composites, i.e., process and physical property improvements are also documented for compositions containing said additives and particulate materials and/or composites in polymeric dispersions, and/or compositions of said particulates with said organic aluminates, titanates and zirconates.

4 Claims, No Drawings

ELECTRO CONDUCTIVE POLYMER COMPOSITIONS AND NEW MATERIALS FOUND USEFUL IN THEIR PREPARATION

This is a division of application Ser. No. 186,421, filed Sept. 12, 1980.

BACKGROUND OF THE INVENTION

Preparation of new and novel and useful electro-conductive polymer compositions is herein described. These compositions are produced by the dispersion of electrically conductive particulates in polymer vehicles. The conductivity of said dispersions as well as their ease of preparation, fabrication, and in many instances the resulting product's physical properties are shown to be substantially improved via the introduction of minor proportions of certain new and novel organo aluminates, titanates and/or zirconates of this invention. Additionally shown to be useful in production of comparably improved compositions are certain heretofore described organotitanates.

A proposed explanation of the mechanism of utility of these additives together with data describing the preparation of preferred embodiments of the aluminates, titanates and zirconates useful in the practice of this invention are hereinafter provided.

It has long been known to those skilled in the art that the dispersion of conductive particulates in polymeric media provides a means for the production of conductive compositions which enjoy varying proportions of the advantages of formability, corrosion protection and ease of application associated with the polymer matrix. Unfortunately, such compositions usually lose a very substantial proportion of the conductivity of the particulate being dispersed, and furthermore present substantial difficulties in preparation, fabrication and stabilization prior to usage. It has now been shown that certain aluminates, titanates and zirconates are the instant invention as well as certain analogous organotitanates heretofore described. When employed singly or in combination at levels based on conductor content of from 0.001 to about 5%, preferably from about 0.1% to about 1%, said additives will substantially enhance conductivity, the ease of manufacture and both stability and formability of the resulting dispersions.

The generic structure of the additives useful in the instant invention is shown in structures I and II.

$$(RO)_a(R^1O)_bM(C)_c(D)_d(E)_e \qquad \text{I.}$$

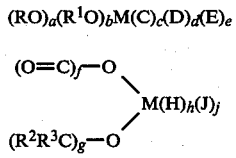

II.

wherein, M is chosen from among aluminum, titanium and zirconium, a and b are independently 0, 1 or 2 within the constraint that a+b must equal 1 or 2; c, d and e are independently each 0, 1, 2 or 3 within the constraint that c+d+e must equal 3−(a+b) when M is aluminum or 4−(a+b) when M is either titanium or zirconium; f is 0 or 1, g is 1, 2 or 3 within the constraint that f+g must equal 2 or 3, h and j are independently each 0, 1 or 2 within the constraint that j+h must equal 1 when M is aluminum or 2 when M is either titanium or zirconium. R and $R^1$ are each independently chosen from among monovalent 1 to 12 carbon alkyl groups, 2 to 12 carbon alkenyl groups, and 7 to 12 carbon aralkyl groups. Each of the aforegoing choices for R and $R^1$ may optionally contain up to 2 carbon bound halogen atoms and/or up to 3 ether linked oxygen atoms. $R^2$ and $R^3$ are each independently either hydrogen or chosen from among the same groups as given above for R and $R^1$. C, D, E and J are monovalent ligands each independently chosen from among monovalent mono, di, or tri amine substituted; alkanols having from 1 to 18 carbon atoms, aryl alcohols having from 6 to 12 carbon atoms each or alkenols having from 2 to 18 carbon atoms each. Each of the above groups may optionally contain up to 2 saturated (1 to 8 carbon) or unsaturated (1 to 8 carbon) carboxamide and/or up to 3 aromatic chlorine or bromine substituents and/or up to 3 ether oxygen atoms. Alternatively, C, D, E, H and J may be independently chosen from among di and tri ester pyrophosphates having the generic formulae:

$$-OP(O)(OR^5)OP(OR^6)(OR^7)(O) \qquad \text{III.}$$

wherein, $R^5$, $R^6$ and $R^7$ are all monovalent groups either all independently chosen from among: alkyl groups having from 1 to 18 carbon atoms each, alkenyl groups having from 2 to 18 carbon atoms each, aryl and aralkyl groups having from 7 to 12 carbon atoms each. $R^5$, $R^6$ and/or $R^7$ may each contain up to 2 aromatic bound chlorine or bromine substituents or up to 4 ether bound oxygen atoms; or two members of the set $R^5$, $R^6$, $R^7$ may be chosen as indicated above and the third may be chosen from among: hydrogen, an amine having the formula IV or a phosphate having the formula V.

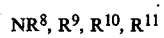

$$NR^8, R^9, R^{10}, R^{11} \qquad \text{IV.}$$

$$HP(OR^{12})(OR^{13})(OR^{14}) \qquad \text{V.}$$

wherein, $R^8$, $R^9$, $R^{10}$ and $R^{11}$ are each monovalent groups chosen from among hydrogen, or the same groups as given for R and $R^1$, alternatively two or more of the groups $R^8$, $R^9$, $R^{10}$ and/or $R^{11}$ may join to form a divalent or trivalent group attached to nitrogen in such a manner as to form ring structures (e.g., N-methyl, N-phenylmorpholinium). Alternatively, $R^8$, $R^9$ and $R^{10}$ may be chosen as indicated above and $R^{11}$ chosen from among 1 to 6 carbon alkyl, 6 to 12 carbon and aralkyl or alkenyl groups having 1 or 2 acrylato, acrylamido, methacrylato or methacrylamido substituents, or any combination thereof totaling either 1 or 2 substituents or up to 2 carbon bound hydroxyl groups. $R^{12}$ may be chosen from the same groups as for $R^8$ and $R^{13}$ and $R^{14}$ may be each independently chosen from the same groups as for $R^8$ except for hydrogen. Ring structures produced via joining two or more of the ligands $R^{12}$, $R^{13}$, $R^{14}$ may also be employed, e.g.,

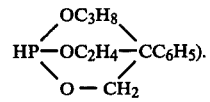

All of the organoaluminates and zirconates embodied in formulae I and II are new and novel compounds as are those organotitanates embodied in said formulae wherein $R^5$ is other than H, an amine salt, or a protonated diallyl phosphite.

Preferred embodiment of the instant invention are those in which R and $R^1$ contain from 1 to 6 carbon atoms each and wherein $R^2$ and $R^3$ are each chosen from any hydrogen methyl or ethyl groups. Preferred methods for the introduction of the aluminate, titanate and/or zirconate additive is dependent, in a large part, upon the nature of the polymer vehicle being employed, particularly its melting point and the processing temperatures to be utilized. In most applications wherein the thermal decomposition temperature of the additive(s) is exceeded prior to liquification of the vehicle, it is necessary to mechanically preblend the additive(s) with the conductive particulate is such a fashion as to obtain a thoroughly coated particulate, preferred coating levels do not exceed 5 additive molecules in depth and most preferred are those in which the additive coating level is 1 molecular thickness of additive, i.e., 0.01 to 5 wt.% on particulate, preferably 0.1 to 1.0 wt.% on particulate depending upon functional surface area. Such coatings may be achieved via the simple expedient of mechanically blending by providing adequate time and shear of the additive(s) with the conductive particulate at temperatures in the range of approximately $-60°$ to approximately $200°-500°$ C. with the upper limit being determined by the thermal decomposition temperature of the additives. If desired, a compatibilizing fluid such as inert vehicle, e.g., hydrocarbon solvent, alkanol, ester, ether, or in some instances water, may be employed to improve contact potential of the additives with the particulate. Subsequently, the vehicle, if employed, may be removed by techniques well known to the art or in the case of formulations in which the vehicle is a tolerable diluent left in place on the coated particulate. Equipment suitable for such mechanical preblending includes, but is not limited to high shear mixers such as Henschels, moderate shear mixing equipment such as a Patterson-Kelly, cone blenders, and over prolonged periods, lower specific energy equipment such as ribbon blenders. The techniques employed in preblending the additives of the instant invention with the conductive particulates are not critical to the utility of the products of this invention. All that is critical is that the coating applied be thin and uniform and that the major portion of the surface of the conductor be largly covered with additive(s). Once the additive has been applied to the conductive particulate, either through in situ methodology or via preblending, the thermal stability of the treated composite additive/conductive particulate is substantially increased, therefore, stabilizing the composite product sufficiently to permit processing by conventional techniques at temperatures to and, in many instances, in excess of 650° C. (in inert atmospheres). As a practical matter, the in situ technique is most readily employed in those polymer vehicles which are adequately mobile for processing at temperatures below approximately 300° C. and the preblend technique is generally preferred for applications in higher temperature process systems. Examples of the new and novel additives of the instant invention are given in Table 1 and examples of those previously described organotitanates which are useful in the practice of the instant invention are given in Table 1b.

TABLE 1

| | |
|---|---|
| K, | $CH_3OC_2H_4OC_2H_4OAl(OC_6H_4NHCH=CH_2)_2$ |
| L, | $(CH_3)_3COAl(OC_2H_4NHC_2H_4NH_2)(OC_2H_4OC_2H_4NHCH_3)$ |
| M, | $((C_2H_5O-C_2H_4)_2CHO)_2AlOC_6H_3Br_2NHCH(CH_3)_2CH_3$ |
| N, | $(CH_3)_2CHOAlO(CH_2)_6N(CH_3)_2(OCH_3)$ |
| O, | $CH_2=CHCH_2OAlOP(O)(OH)OP(O)(OCH_3)(OC_4H_7)$ $OP(O)(OC_6H_{11})OP(OCH=CH_2)(OC_6H_4C_2H_5)$ |
| P, | $C_5H_9OAlOP(O)((ONH(C_2H_4OCOCH=CH_2)(CH_3)_2))OP(O)(OC_8H_7)(OC_4H_9)_2$ |
| Q, | $\begin{array}{l} CH_2-O-Al(OP(O)(OC_2H_5)OP(O)(OC_6H_5)((OHP(OC_2H_4OC_2H_5)(OCH_2C_6H_4Cl)) \\ | \quad / \\ CH_3CH-O \end{array}$ |
| R, | $\begin{array}{l} O-C-O-Al(OCH(C_4H_9)(CH_2NH_2)) \\ \quad\quad\quad / \\ CH_2-O \end{array}$ |
| S, | $(C_5H_9O)(C_2H_5O)Ti((OP(O)(OC_6H_4Cl))P(O)(OCH=CH_2)_2))_2$ |
| T, | $(OCH_2CH(CH_3)CH_2O)TiOP(O)(OCH_2C_6H_4CH_3)OP(O)(OCH_3)((OCH(C_6H_5)_2))$ $OP(OH)(O)OP(O)(OC_2H_5)_2$ |
| U, | $(CH_3O)(CH_3OCH=CH_2O)ZrOCH_2N(CH_3)(C_6H_{11})_2$ |
| V, | $(n-C_9H_{19}O)Zr((O(CH_2)_4NH_2))(OC_2H_4NHC_2H_4NH_2)_2$ |
| X, | $(OC(O)(CH_2)_2O)ZrOP(O)(OCH_3)OP(O)((ON-(C_2H_4)_3(CH_3))$ |
| Y, | $(C_6H_5CH_2O)_2Zr((OP(O)(OH)OP(O)(OC_4H_9)_2))_2$ |
| Z, | $(CH_3O)ZrOP(O)((OHP(OH)(OCH_3)_2))OP(O)(OCH_3)(OC_5H_{11})$ $((OP(O)(OCH_3)OP(O)(OC_5H_{11})((OHP(OCH_3)_3))$ $((OP(O)(OC_5H_{11})OP(O)(OCH_3)((OHP(OCH_3)_3))$ |
| AA, | $C_2H_5OZr(OC_2H_4NHC_2H_4NHC_2H_4NH_2)_3$ |
| AB, | $((CH_3)_2CHO))_2ZrOP(O)(OH)OP(O)(OC_2H_5)OC_4H_9)$ $OP(O)(ONH_3CH_2OH)OP(OC_2H_5)(OC_4H_9)$ |
| AC, | $CH_3)ZrOP(O)((ONH(C_2H_4OH)_3)(OP(O)(OC_8H_{17})_2$ |
| AD, | $(CH_3)_2CHO_2Ti(OP(O)(OC_3H_{17})OP(O)(OC_8H_{17})_2$ |

TABLE 1b

| | |
|---|---|
| BA, | $(CH_3)_2CHOTi(OC_2H_4NHC_2H_4NH_2)_3$ |
| BB, | $(OCH_2)_2Ti((OP(O)(OH)OP(O)(OC_8H_{17})_2))_2$ |
| BC, | $(CH_3)_2CHOTiOP(O)((OHP(OH(OC_8H_{17})_2))(OP(O)(OCH_3)(OC_4H_9)_3$ |
| BD, | $((CH_3)_2CHO))_2Ti((OC_2H_4N(C_2H_4OH)_2))_2$ |

It should be noted that the examples provided in the above mentioned tables are intended to be illustrative rather than exhaustive of the molecular variations of organo aluminates, titanates and zirconates heretofore described generically which have been found useful in the production of highly electroconductive polymeric composites and that many other analogous variations and combination of the various component ligands and/or additives will be obvious to those skilled in the art.

Examples 1 and 2 are illustrative of techniques which may be employed to produce the additives of the instant invention and examples 3 through 7 are illustrative of processes whereby the use of the above mentioned additives may be beneficially applied to the surface of conductive particulates in order to produce composite materials suitable for incorporation into the highly conductive polymeric composites of the instant invention. Neither the process information with respect to additive preparation nor that associated with the application of said additives to conductive particulates and/or composites is intended to be exhaustive. Those skilled in the art will easily observe that substantially unlimited variations of well known organic chemical and mechanical technology respectively may be employed to produce the indicated additives and/or treated conductive particulates and/or composites respectively. It should be noted that the utility of the additives of this invention, for the purpose indicated, is surprising since the additives themselves are very poorly conductive and as such, one would expect that a surface layer of said additive on a relatively highly conductive material would degrade rather than improve the latter's conductivity contribution in a dispersion. Examples 8 through 20 are illustrative of the production of highly conductive composites by the incorporation of organometallic additives of the type heretofore described and a conductive particulate in a polymeric matrix. In many instances, it is not necessary to isolate the organometallic additive useful in the practice of this invention in the pure form in that such materials produced as a component of a mixture have been employed directly with excellent effect. Specific illustration of the last are given in examples 8 through 14, whereas examples of the pretreatment of particulate technique and usage of pretreated particulates are given in Examples 15, 16, 17 and 18, and the examples of in situ application of prepurified additive are given in Examples 19 through 24, respectively. Those skilled in the art will be fully cognizant of the fact that the examples given may be essentially reproduced in terms of their utility via obvious modification and/or alternative technology well known to those skilled in the art without departing from the essential novelty and utility associated with the products of the instant invention which comprise the new and novel aluminates, titanates and zirconates and the fully described heretofore, composites produced by the application of the aforesaid additives and other organotitanates previously described to produce conductive particulates and ternary products employing said organometallic additives in conjunction with conductive particulates and polymer or resin substrates or binders or particulate conductive materials pretreated with the above mentioned organometallics utilized in conjunction with polymeric substrates resins or binders in order to produce highly conductive polymeric composites.

Further objects of this invention and substantial substantiation of their novelty and utility will become apparent to the reader upon studying the examples hereinafter provided.

EXAMPLE 1

Preparation of (3.6-dioxa)-a-heptyl, di(p-vinylamino)-phenyl aluminate (K): To a two l, pyrex reactor system equipped with a mechanical stirrer, water, cooled condenser, thermoregulator controlled external heating-/cooling and an addition funnel was added 1 liter of dry cyclohexane and 204 g (1.0M) of aluminum isopropoxide, agitation was started and 120 g (1.0M) of diethylene glycol, monomethyl ether was added via the addition funnel over a 10 minute period. The only indication of reaction was a temperature rise (approximately adiabatic) of from 24° to 31° C. of the pot contents. 270 g (2.0M) of p-(N-vinyl) amino-phenol was then added portion wise over a period of approximately 1 hour (modest exotherm to 38° C.), thereby producing a voluminous pale yellow platelike precipitate. The precipitate was vacuum filtered, washed with cyclohexane (500 ml) and recrystallized from diethyleneglycol dimethyl ether to yield 362 g (87% yield) of the title compound as large pale yellow plates mp 93°–95° C. Calculated for Al $C_{21}H_{27}N_2O_5$: C,60.9; H,6.5; n,6.8; Al,6.5. Found: C,60.5; H,6.7; N,6.4, Al,6.5.

Similarly prepared were compounds L, M and N, raw materials, yields, and finished product properties are given in Table 2. Compounds, O, P, RU, U, Y, and AA were prepared by a modification of the procedure given in Example 1 wherein a 1:1 by volume solution of toluene in cyclohexane replaced diethyleneglycol dimethyl ether as the recrystallization solvent. Raw materials, yields, and finished product properties are also given in Table 2.

TABLE #2

Synthesis, Analysis and Properties of Electroconductivity Enhancing Additives
Prepared via the Procedure given in Example #1.
Raw materials added in sequence indicated

| Compound Identification | Raw Materials | Moles Employed | Product Yield % | Mp °C. | % C Calc/found | % M Calc/found |
|---|---|---|---|---|---|---|
| L | 1. Al(t-$C_4H_9O$)$_3$ | 1.0 | 72 | 26 ± 3 | 54.1/58.9 | 9.61/9.69 |
|  | 2. $HOC_2H_4NHC_2H_4NH_2$ | 1.0 |  |  |  |  |
|  | 3. $HOC_2H_4OC_2H_4NHCH_3$ |  |  |  |  |  |
| M | 1. Al((OCH($C_2H_4OC_2H_5$)$_2$)$_3$ | 1.0 | 68 | 54 ± 2 | 49.8/50.0 | 5.90/5.83 |
|  | 2. $HOC_6H_3Br_2NH.IC_3H_7$ | 1.0 |  |  |  |  |
| N | 1. Al((OCH($CH_3$)$_2$))$_3$ | 1.0 |  |  |  |  |
|  | 2. $HOCH_3$ | 1.0 | 54 | 0 | 55.0/55.2 | 10.3/10.5 |
|  | 3. HO($CH_2$)$_6$N($CH_3$)$_2$ | 1.0 |  |  |  |  |
| O | 1. (HO)$_2$P(O)OP(O)(OCH$_3$)(OC$_4$H$_7$) | 1.0 |  |  |  |  |
|  | 2. HOP(O)(OC$_6$H$_{11}$)OP(O)(OCH=CH$_2$)(OC$_6$H$_4$C$_2$H$_5$) | 1.0 | 73 | 106 ± 2 | 40.1/39.8 | 3.76/3.68 |
|  | 3. Al(OCH$_2$CH=CH$_2$)$_3$ | 1.0 |  |  |  |  |

| Compound Identification | Raw Materials | Moles Employed | MP °C. Yield % | % C Calc/found | % M Calc/found |
|---|---|---|---|---|---|

TABLE #2-continued
Synthesis, Analysis and Properties of Electroconductivity Enhancing Additives
Prepared via the Procedure given in Example #1.
Raw materials added in sequence indicated

| Compound | Raw Materials | Moles Employed | Product Yield % | Mp °C. | % C Calc/found | % M Calc/found |
|---|---|---|---|---|---|---|
| P | 1. $HOP(O)(ONH(C_2H_4OCOCH=CH_2))$ $(CH_3)_2OP(O)(OC_8H_{17})(OC_4H_9)$ | 2.0 | $\underline{143 \pm 2}$ 69 | | 38.8/38.5 | 3.64/3.59 |
|   | 2. $Al(OC_5H_9)_3$ | 1.0 | | | | |
| R | 1. $Al(O-i-C_3H_7)_3$ | 1.0 | $\underline{78 \pm 3}$ 61 | | 47.8 48.1 | 13.4 13.1 |
|   | 2. $HOCH(C_4H_9)(CH_2NH_2)$ | 1.0 | | | | |
|   | 3. $HOCOCH_2OH$ | 1.0 | | | | |
| S | 1. $Ti(OC_2H_5)_4$ | 1.0 | | | | |
|   | 2. $HOP(O)(OC_6H_4CH_3)OP(O)(OCH=CH_2)_2$ | 2.0 | $\underline{73 \pm 2}$ 75 | | 37.8/37.5 | 5.71/5.63 |
|   | 3. $HOC_5H_9$ | 1.0 | | | | |
| U | 1. $Zr(OCH_3)_3(OCH=CH_2CH_3)$ | 1.0 | $\underline{63 \pm 3}$ 58 | | 51.7/51.4 | 19.6/19.4 |
|   | 2. $HOCH_2N(CH_3)(C_6H_{11})$ | 2.0 | | | | |
| V | 1. $Zr(OC_9H_{19})_4$ | 1.0 | | | | |
|   | 2. $HO-m-C_4H_8NH_2$ | 1.0 | $\underline{57 \pm 3}$ 78 | | 47.8/48.1 | 17.2/17.3 |
|   | 3. $HO(C_2H_4NH)_2C_2H_4NH_2$ | | | | | |
| Y | 1. $Zr(OCH_2C_6H_5)_4$ | 1.0 | $\underline{102 \pm 1}$ 74 | | 42.5/42.6 | 10.0/9.8 |
|   | 2. $(HO)_2P(O)OP(O)(OC_4H_9)_2$ | 2.0 | | | | |

| Compound Identification | Raw Materials | Moles Employed | Product Yield % | Mp °C. | % C Calc/found | % M Calc/found |
|---|---|---|---|---|---|---|
| AA | 1. $Zr(OC_2H_5)_3$ 2. $HOC_2H_4NHC_2H_4NHC_2H_4NH_2$ | 1.0 3.0 | 67 | $81 \pm 3$ | 41.8/41.9 | 15.9/15.6 |

EXAMPLE 2

In an apparatus similar to that employed in Example 1 except that a vent gas scrubber containing 2.1 of 2.5 normal aqueous sodium hydroxide was added (1.0 mole) of ethanol, 86 g (1.0 mole) of cyclopentanol and 1 l. of cyclohexane 189.7 g. (1.0 mole) of titanium tetrachloride was added through the funnel over a period of 45 minutes during which the reaction mix temperature was maintained at $31 \pm 5°$ C. by external cooling. After completion of $TiCl_4$ addition 699 g (2.0 mole) of chlorophenyl, divinyl pyrophosphoric acid was added over a period of 30 minutes @ $34 \pm 6°$ C. (external cooling required) via the addition funnel. Evolution of gas was vigorous throughout the addition of $TiCl_4$ and pyrophosphate. The resultant white precipitate was collected, washed with 200 ml of cyclohexane and dried in vacuum @ 40° C. to yield 749 g (85%) of white platelets mp 72° to 74° C. Calculated for Titanium (IV) bis (chlorophenyl) (divinyl) pyrophosphate, cyclopentoxy, ethoxy; (Compound 5) $C_{27}H_{34}O_{12}Cl_2P_4Ti$: C, 37.8; H, 3.87, Cl, 8.09; P 16.4, Found: C, 37.8, H, 3.95; Cl, 8.20; P, 16.1. Analysis of the scrubber solution showed an absorption of 3.85 moles of acid vs. the expected 4.0 moles of HCl liberated, well within acceptable error of the procedure. Similarly prepared were compounds, O, T, X, Y, Z, and BB. Compounds BC, AB, and P were prepared via a modification of this procedure wherein the appropriate base was added at the end of the above reaction sequence but before product isolation. Components, order of addition, yields and product analysis and properties for the preparation of compounds O, P, T, X, Y, Z, AB BB and BC via the above procedure are given in Table #3.

TABLE #3
Synthesis, Analysis and Properties of Electroconductivity Enhancing Additives
Prepared Via the Procedure Given in Example #2

| Compound Identification | Raw Materials | Moles Employed | Product Yield % | MP °C. | % C Calc/found | % M Calc/found |
|---|---|---|---|---|---|---|
| O | 1. $(HO)_2P(O)OP(O)(OCH_3)(OC_4H_7)$ | 1.0 | | | | |
|   | 2. $(HO)P(O)(OC_6H_{11})OP(O)(OCH=CH_2)(OC_{6H4}C_2H_5)$ | 1.0 | 78 | $108 \pm 1$ | 40.1/39.7 | 3.76/3.82 |
|   | 3. $AlCl_3$ | 1.0 | | | | |
| P | 1. $HOP(O)(OH)OP(O)(OC_8H_{17})(OC_4H_9)$ | 2.0 | | | | |
|   | 2. $AlCl_3$ | 1.0 | 69 | $144 \pm 2$ | 38.8/38.9 | 3.64/3.56 |
|   | 3. $N(CH_3)_2(C_2H_4OCOCH=CH_2)$ | 2.0 | | | | |
| T | 1. $HOP(OCH_2C_6H_4CH_3)(O)OP(O)(OCH_3)((OCH(C_6H_5)_2))$ | 1.0 | | | | |
|   | 2. $(HO)_2P(O)OP(O)(OC_2H_5)_2$ | 1.0 | 61 | $79 \pm 3$ | 42.8/42.5 | 5.83/5.79 |
|   | 3. $TiCl_4$ | 1.0 | | | | |
|   | 4. $HOCH_2CH(CH_3)CH_2OH$ | 1.0 | | | | |
| X | 1. $HOP(O)(OCH_3)OP(ON((C_2H_4)_3))(CH_3))$ | 2.0 | 58 | $91 \pm 2$ | 33.1/32.8 | 10.9/10.6 |
|   | 2. $ZrCl_4$ | 1.0 | | | | |
|   | 3. $HOC(O)C_2H_4OH$ | 1.0 | | | | |
| Y | 1. $(HO)_2P(O)OP(O)(OC_4H_9)_2$ | 1.0 | | | | |
|   | 2. $ZrBr_4$ | 1.0 | 71 | $103 \pm 2$ | 42.5/43.1 | 10.0/10.3 |
|   | 3. $HOCH_2C_6H_5$ | 2.0 | | | | |
| Z | 1. $HOP(O)((OHP(OH)(OCH_3)_2))OP(O)(OCH_3)(OC_5H_{11})$ | 1.0 | | | | |

TABLE #3-continued

Synthesis, Analysis and Properties of Electroconductivity Enhancing Additives
Prepared Via the Procedure Given in Example #2

| Compound Identification | Raw Materials | Moles Employed | Product Yield % | MP °C. | % C Calc/found | % M Calc/found |
|---|---|---|---|---|---|---|
| | 2. HOP(O)(OCH$_3$)OP(O)(OC$_5$H$_{11}$)((OHP(OCH$_3$)$_3$)) | 1.0 | 63 | 81 ± 3 | 29.1/28.8 | 4.41/4.28 |
| | 3. HOP(O)(OC$_5$H$_{11}$)OP(O)(OCH$_3$)((OHP(OCH$_3$)$_3$)) | 1.0 | | | | |
| | 4. ZrCl$_4$ | | | | | |
| | 5. HOCH$_3$ | | | | | |
| AB | 1. (HO)$_2$P(O)OP(O)(OC$_2$H$_5$)(OC$_4$H$_9$) | 2.0 | | | | |
| | 2. ZrCl$_4$ | 1.0 | 58 | 96 ± 1 | 30.8/31.2 | 11.7/11.5 |
| | 3. HOCH(CH$_3$)$_2$C(CH$_3$)$_2$OH | 1.0 | | | | |
| | 4. NH$_2$C$_2$H$_4$OH | 1.0 | | | | |
| BB | 1. (HO)$_2$P(O)OP(O)(OC$_8$H$_{17}$)$_2$ | 2.0 | | | | |
| | 2. TiCl$_4$ | 1.0 | 47 | 49 ± 2 | 43.3/42.9 | 5.52/5.38 |
| | 3. HOCH$_2$CH$_2$OH | 1.0 | | | | |
| BC | 1. (HO)$_2$P(O)OP(O)(OC$_4$H$_9$)(OCH$_3$) | 3.0 | | | | |
| | 2. TiCl$_4$ | 1.0 | 38 | 0 | 40.4/39.9 | 2.78/2.91 |
| | 3. (CH$_3$)$_2$CHOH | 1.0 | | | | |
| | 4. HP(O)(OC$_8$H$_{17}$)$_2$ | 3.0 | | | | |

EXAMPLE 3

This example teaches the preparation of additive coated metallic particulates via dry blending of the appropriate components in an intensive mixer.

One thousand g of aluminum powder (nominal particle size minus 325 mesh) was placed in a one gallon Henschel (Trademark of the Prodox Henschel Co.) mixer and agitated @ 1800 RPM at ambient temperature during the addition over a period of one minute of 5.0 g of compound BB in aerosol form. Mixing was continued for an additional minute and the product thoroughly mixed with an equal weight of polyethylene glycol 600 (Union Carbide Corp.) Brookfield* viscosity of the dispersion at 25° C. was 840 centipoise as compared with a value of 37,900 centipoise and an electrical resistivity of 26 ohm/cm was observed vs. 31,850 ohm/cm for the additive treated and control compound produced and processed identically, respectively.
*(Trademark of Brookfield Corp.)

EXAMPLE 4

This process teaches the utility of a fluidized bed technique for the application of additives to metallic particulates.

Twenty-five hundred grams of copper powder nominal particle size average 0.2 microns together with 2.8 g of compound BA were passed through a 6×75 cm fluidized bed over a period of 2 hours using a 200 liter/hr nitrogen carrier gas and the effluent particulate collected in cyclones. Similarly treated were samples with compounds K, S, Z, AA and an untreated control. The conductivities of these particulates were evaluated in dispersions in EPDM (c.f. Example 15).

EXAMPLE 5

This example teaches the use of a ribbon blender to produce additive coated highly conductive particulates.

Five thousand grams of tin powder (nominal −325 mesh) together with 5.8 g of compound AD were mixed in a steam jacket (130° C.) ribbon blender for 1.3 hours after which the batch was collected, and the process repeated separately employing like proportions of compounds O, Q, R, V and a control (no additive). The resulting products were evaluated in unsaturated polyester resin (c.f. Example 16).

EXAMPLE 6

This example teaches the utility of solution coating-solvent evaporation as a technique for the application of the additives of the instant invention to metallic particulates a means of enhancing the latter's conductivity.

Five hundred grams of carbonyl reduced nickel powder was added to a Cowles Dissolver (Moorehouse Cowles Co.) agitated solution of 3 g of compound P in 1 l of water maintained at 60° C. by external heating. After mixing for 3 minutes the aqueous phase was separated by decantation and the residual powder washed three times by slurrying with 1 l each time of water, then vacuum dried at 90° C. (10 mm H$_2$) to yield 498 g of product. Comparably prepared were nickel treated with either compounds AB, AC and a control (no additive).

The resultant products were evaluated in a nylon matrix (c.f. Example XVIII).

EXAMPLE 7

This example teaches the application of the additives of the instant invention to carbon black employing a reactive vehicle as a carrier.

Twelve grams of compound S as a 20 percent solution in acrylamide was spray applied as an aerosol to 2000 g of conductive carbon black. (Ketjan Black-Armak Co.) maintained in a 50° C. boiling fluidized bed over a period of 20 seconds. The bed temperature was then raised to 400° C. over a period of 15 seconds (via external heating) to flash polymerize the acrylamide. Similarly prepared were particulates containing either compounds Z or BC and a control (no additive).

The products produced were evaluated in polysulfone (c.f. Example XVIII).

EXAMPLE 8

This example teaches the preparation and use of additives of the instant invention in situ, as opposed to premanufacture, isolation and particulate pretreatment technique employed in Examples 1 through 7 inclusive.

One half gram of contained (calculated as a theoretical yield) crude compound L reaction mass (prepared as described in Example 1) was added to 200 g of long oil alkyd (Cargill) followed by thorough admixture with 100 g of iron powder (nominal particle size 1.0 microns). Portions of the resulting dispersion (Hegman grind 0.2 to 3) were drawn down to 20 mils thickness on a standard paint test chart and permitted to air dry at ambient for four days. Similarly prepared were dispersions and test panels using analogous preparations of compounds Q and Z and a control. The respective resistivities for test, the pannels containing additives L, Q, Z and the control were found to be $4\times10^8$, $7\times10^6$, $1\times10^6$ and $6\times10^{12}$ ohm/cm respectively, thus showing the enhanced conductivity (several orders of magnitude in each case) produced by appropriate additive addition.

EXAMPLE 9

This example teaches the utility of in situ treatment of brass powder in low density polyethylene with non-isolated additives of the instant invention.

Seven grams (contained on a 100% yield basis) of compound N prepared in a manner as described in example 1 except that p-dioxane replaced the diglyme employed in that example (resulting in a soluble product) was added to a lab scale Bambury (Trademark of Farrel Corp.) mixer containing 5 kg of brass powder (−400 mesh) and 3 kg of low density polyethylene (Union Carbide #4610) at 100° C. The mixture was then mixed for 10 minutes to produce a fluxed product (maximum temperature 155° C.). The resulting dough-like mass was extruded using a 24:1 1" Killion (Trademark of the Killion Corp.) extruder to produce 1"×0.2" strip. Similarly prepared were strips containing like proportions of compound P and a control. Surface resistivities of the resulting strips were $4\times10^7$, $7\times10^7$ and $6\times10^{10}$ ohm/cm respectivey clearly showing the enhancement of conductivity produced by the additives of the instant invention when used in said systems.

EXAMPLE 10

This example teaches the utility of in situ prepared and applied additives of the instant invention for the promotion of conductivity in zinc filled flexible vinyl.

Four tenths of a gram of compound U was prepared via the procedure given in Example 1 with the exception that 500 g of dioctyl phthalate was used as a solvent in place of diglyme. To the resulting solution was added 750 g of zinc powder (−325 mesh followed by thorough mixing and the sequential addition of 750 g of polyvinyl chloride resin (Geon 30, B. F. Goodrich Co.) and 25 g of epoxidized soya oil (Paraplex G-62), Rohm & Hass) and 7.5 g of powdered litharge. The resultant dispersion was fluxed on a two roll (rubber type) mill at 100° C. and test samples were compression molded at 170° C. to produce 0.125×15×15 cm slabs. Comparable test samples employing compounds BB and BD were similarly produced as was a control. Resistivities found for systems containing additives U, BB and BD were $6\times10^3$, $9\times10^2$ and $1\times10^2$ vs. $3\times10^6$ for the control; an improvement of 1 to 10 thousand fold.

EXAMPLE 11

To 100 g of phenolic resin containing 0.1 g of an additive of this invention chosen from among compounds K, L or AD prepared as described in Example 1 (Except that p-dioxane was employed in place of the cyclohexane used in said example, which substitution resulted in the nonseparation of product from the reaction mixture; the product was therefore employed as a crude solution in p-dioxane in each case.) was thoroughly hand mixed with 300 g of magnesium powder (nominal particle size −400 mesh).

The resulting dispersions were molded and oven cured for 1 hour at 180° C. After equilibration at 75±2° C. overnight. The resulting 3 mm×25 mm×200 mm rods were evaluated for compression strength and electrical resistivity vs. a control (non additive containing similarly processed sample). It was found that compressive strength and electrical resistivities for samples containing additives K, L, or D and the control were 6100, 5650, 8000 and 3950 psi and 680, 450, 230 and 17,800 ohm/cm respectively. Cleary establishing the utility of additives heretofore described for the improvement of both physical properties and electrical conductivities of phenolics.

EXAMPLE 12

This example teaches the utility of herein described organometallics as conductivity enhances in cellulose acetate butyrate resin containing conductive particulate:

Ten grams of crude solutions (contained basis, assuming theoretical yield) of compounds L, R, or BA prepared by a procedure analogous to that described in Example 1 except that trimethylolpropane tri n-octyl ether replaced the cyclohexane employed in the cited example were separately absorbed into 2000 gram samples of cellulose acetate butyrate (Eastman #731, a trademark of Eastman Kodak Co.) and the resulting material compounded in a 24:1 vented Killion (Trademark Killion Corp.) extruder with 4000 g of aluminum flakes (nominal 2×4×0.2 mm size, Transmet Corp.) at 190° to 230° C. barrel temperature. The resulting composite profile extrusions were evaluated via an analogous control compound (no additive) for tensile and electrical resistance properties. Tensile strength and electrical resistance for composites containing additives L, R, BA or none (control) were 5250, 4690, 5420, and 2150 psi and 85, 96, 49 and 105,450 ohm/cm respectively.

EXAMPLE 14

This example teaches the utility of certain organometallic additives employed as crude preparations to upgrade the electrical conductivity and to accelerate the cure of titanium sponge filled melamine cured epoxy conductors. Further processing advantages via viscosity reduction of the intermediate dispersions are also demonstrated.

Commercial titanium sponge (Titanium Metals Ltd.) was ground and sieved to produce a fraction of 100% 325±75 mesh size. One hundred grams of said Ti particulate was then incorporated, using a Cowles Dissolver, into 500 ml of a 17% solution of Epon 1002 epoxy resin (Trademark of Shell Chemical Co.) and 3% hydroxymethyl melamine in xylene. Brookfield viscosity of the resulting dispersion was measured after 24 hours at 25°±2° C. followed by oven curing of a 5 mm thick 5 mm round disc of material (contained in an aluminum form at 140° C. for periods sufficient to effect complete cure (12,000±psi for demolded samples equilibrated at 25±2° C. for 24 hours). Electrical resistivities of demolded samples were measured at 25±2° C.

Similarly prepared were analogous samples containing 0.25 g of specified crude additive (prepared in xylene via the procedure given in Example 1). Results are given in Table #4.

TABLE #4

Effect of selected additives on the cure time, viscosity and electrical conductivity (of cured) melamine modified epoxy.

| Additive | Min. Cure Time @ 140° C. Min. | Brookfield Viscosity @ 25° C. @ 10 RPM in Poise | Resistivity ohm/cm |
|---|---|---|---|
| None | 42 | 8.4 | $6.7 \times 10^5$ |
| Q | 15 | 2.1 | $1.4 \times 10^3$ |
| R | 21 | 1.7 | $1.9 \times 10^3$ |
| BC | 12 | 0.9 | $3.5 \times 10^2$ |

EXAMPLE 15

This example teaches the use of pretreated composites to improve conductivity in elastomers 300 grams of copper powder pretreated with 0.11% of compound BA as described in Example 4 was admixed on a two roll rubber mill into an ethylene-propylene rubber formulation containing 100 g of rubber (Vistalon 404; Trademark of Exxon Corp.), two grams each of zinc oxide, stearic acid, dicumyl peroxide and paraffin oil and 0.1 g of litharge. The resulting dispersion was press-mold cured at 180° C. for 10 minutes and evaluated vs. control containing untreated copper filler. The resistivities, tensile strength and elongations at break were 105 ohm/cm, 895 psi, and 640% vs. 340M ohm/cm, 660 psi and 350% for the treated and untreated samples respectively, clearly establishing the advantages of treatment in this instance.

EXAMPLE 16

Four hundred kg of thermoplastic polyester (polybutylene terephthalate Tenite #2132, Eastman Kodak Co.) was compounded at barrel temperatures of 286°–300° C. in a 30:1 L:D vented Berstoff twin screw extruder (Trademark of Berstoff Corp.) with 400 kg of tin powder preblended in a ribbon blender with 5.5 g compound AD as described in Example 5. The extruder output was formed into a 2 mm thick sheet via appropriate die sizing. Evaluation of the product produced showed a resistivity of 3120 ohm/cm vs. 48.8M ohm/cm for a sheet stock comparably produced using untreated particulate. In addition output per joule of power expended was 7.5 kg with the treated material and only 4.6 kg/joule for the run made under identical working conditions with the untreated tin. These data show substantial benefit in both throughput per unit energy expended and product conductivity via incorporation of 0.12% of compound AD (on tin powder) to produce an intermediate composite.

EXAMPLE 17

Three kg of nylon 66 (Zytel-101, Trademark E. I. Dupont Co.) were admixed with 4.5 kg of nickel powder (pretreated with 0.12% of compound (P) as described in Example 6) using a point shaker assembly. The resultant mix was extruded through a 24:1, L:D Werner and Pfleiderer 28 mm twin screw extruder (Trademark Werner and Pfleiderer Corp.) at 280°–300° C., pelletized and injection molded to produce test specimens. Resistivity of the resultant samples was found to be 1800 ohm/cm, vs. 62.5M ohm/cm for samples produced when employing non-treated nickel similarly worked.

The enhancement of conductivity effected via the usage of composition treated filler is thus massive.

EXAMPLE 18

This example teaches the use of composites of carbon black of the instant invention as a means of enhancing the conductivity of conductive black filled polysulfone resin (Trademark Union Carbide Corp.)

One hundred kg of polysulfone resin was drum blended with 50 kg of ketjin black and the resulting mixture extruded at 310°–328° C. barrel temperature through a 24:1, L:D vented Hartig (Trademark Hartig Machinery Corp.) extruder equipped with a profile die to produce a 5×30 mm ribbon which was quenched in a water bath then cut into test strips. The resistivity of a dried test sample of extruded material was found to be 484.5M ohm/cm as compared to similarly constituted and prepared test specimens containing the same carbon load pretreated as shown in Example 7 with 0.6% by weight of compounds S, Z or BC of this invention which resistivity values were 14.6M, 1965, and 21.4M ohm/cm respectively.

EXAMPLE 19

This example teaches the utility of additives of this invention to enhance the conductivity of metal filled polyurethane.

A polyurethane resin prepared by admixture of 200 g of polymeric isocyanate (Upjohn #L143 Trademark Upjohn Corp.) with Voranol 3810, 195 g (Trademark Dow Chemical Co.) in 500 ml of xylene was admixed uxing a Cowles Dissolver with 500 g of nickel powder, nominal particle size 3 microns. The resulting dispersion was applied (using a doctor blade) to glass it 0.3 mm wet thickness and permitted to dry for 72 hours prior to evaluation. Resistivity at 500 volts DC was found to be 162M ohm/cm at 25° C. compared with 42M, and 31.3M for similar formulations to which 2.5 g of either compounds K or S were added (in advance of nickel addition) respectively.

EXAMPLE 20

This example teaches the utility of additives of the instant invention for the improvement of conductivity and reduced system viscosity of silicone polymer compositions containing aluminum flakes.

One kilogram of Viscasil 30M (Trademark General Electric Corp.) was mixed on a Cowles Dissolver at 300 RPM with 500 g of aluminum flakes (Transmit Corp.) and 2.5 g of dicumylperoxide added to a 100 g portion of the dispersion to effect cure at 160° C. in a press mold. Resistivity of a cooled sample of the resulting elastomer was 1865 ohm/cm @ 25° C. By comparison the resistivities of similar samples to which 0.4 wt% of either compounds (based on contained aluminum) P or V of this invention was added prior to cure were 730 and 460 ohm/cm respectively. Simultaneously mix viscosities prior to cure dropped from 362.5M for the control to 72.5M and 81M cps for formulations containing compounds P and V respectively using a Brookfield Viscosimeter @ 25° C.

EXAMPLE 21

This example teaches the use of additives of the instant invention to enhance the electrical and physical properties of polyester elastomers.

One hundred gram samples of Hycar 3000 elastomer (Trademark B. F. Goodrich Corp.) together with 5 g of zinc oxide, 2 g of stearic acid, 1.5 g of powdered sulfur, 20 g of disodecylphthalate, 0.5 g of mercapto benzothiazole, 0.5 g of silver coated glass microspheres (Potter Corp.) were mixed on a two roll rubber mill at 30°-40° C.; then press cured at 160° C. for 20 minutes. The resulting product after cooling to 30° C. had a resistivity of 680M ohm/cm vs. 137M and 1650 for formulations containing 0.7 g of compounds T or X respectively. The corresponding elongations at break (25° C.) were 210%, 380% and 390% for the respective formulations.

EXAMPLE 22

This example teaches the utility of additives of the instant invention for the enhancement of conductivity of filled rigid vinyl formulations.

Ten kg mixtures of equal weights each of PVC resin (Geon 103 EPF-Trademark B. F. Goodrich Corp.) and boron fibers (nominal size 0.3×10 microns) were admixed with 100 g of litharge and 200 g of expoxidized soya oil in a no. 30 Banbury Mixer (Trademark Farrell Corp.) for 15 minutes (peak temperature was 165° C.). A portion of the resulting mix was profile extruded to produce test specimens. Said specimens gave resistivity and tensile strength values of 235M ohm/cm and 9650 psi respectively, whereas similar specimens prepared from batches to which 80 g of compounds O or U of this invention were added gave resistivities of 86M and 46.5M ohm/cm and tensile strengths of 11.6M and 13.3M psi respectively.

EXAMPLE 23

This example teaches the utility of additives of the instant invention for the enhancement of physical and electrical properties of acrylic resins containing carbon filler.

To a solution of 100 g of polymethyl methacrylate (nominal Mw 15,000) in 250 g of methyl ethyl ketone was added 0.3 g of compound R, X or V of the instant invention or no additive (control) followed by 75 g of carbon black (XC-72-Trademark Cabot Corp.) followed by thorough mixing at ambient using a Cowles Dissolver. The resulting dispersions were knife coated at 100 mils wet thickness on Teflon (Trademark E. I. Dupont Corp.) sheets, oven dried at 150° C. for three hours then delaminated and tested. Data are shown in Table #5 (properties measured at 25° C.).

TABLE #5

| Additive | Tensile PSI | Resistance Ohm/ Cm @ 1000V. DC | Flex Modules PSI |
|---|---|---|---|
| None | 1140 | $5 \times 10^8$ | $5.7 \times 10^6$ |
| R | 3190 | $4 \times 10^3$ | $4.2 \times 10^6$ |
| X | 2670 | $3 \times 10^3$ | $4.5 \times 10^6$ |
| V | 5110 | $2 \times 10^1$ | $3.9 \times 10^6$ |

EXAMPLE 24

This example teaches the utility of additives of the instant invention for the advancement of conductivity and physical properties of zinc rich primers.

Equal parts by weight of ethyl silicate and metallic zinc powder nominal particle size 1.4 microns were thoroughly admixed in the presence of 0.6 wt % on zinc of the indicated additive using a paint shaker. The resultant dispersions were evaluated after 3 hours for settlement and doctor blade applied to cold rolled steel at 5 mm thickness, then oven dried at 150° C. at 50% relative humidity, cooled to 25° C. overnight and tested. The results are given in Table #6.

| Additive | Resistivity ohm/cm | Reverse Impact Strength PSI | Mandril Flexability mm |
|---|---|---|---|
| None | $10^{15}$ | 7 | 22 |
| P | $5 \times 10^3$ | 10 | 14 |
| Q | $3 \times 10^3$ | 12 | 12 |
| Y | $4 \times 10^5$ | 9 | 16 |
| Z | $5 \times 10^5$ | 14 | 10 |

Clearly the incorporation of additives of the instant invention is shown to produce substantially more conductive, more flexible, stronger coatings.

I claim:

1. A composition of matter selected from the group consisting of a compound represented by the formula;

$$(RO)_a(R^1O)_bM(C)_c(D)_d(E)_e$$

a compound represented by the formula II;

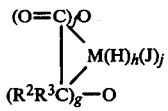

and mixtures of said components;
wherein M is selected from the group consisting of aluminum and zirconium;
a & b are each 0,1 or 2 but a+b must equal 1 or 2;
c,d & e are each 0,1,2 or 3 but c+d must equal 3−(a+b) when M is aluminum; and c+d+e must equal 4−(a+b) when M is zirconium;
f=0 or 1;
g=1,2 or 3 but f+g equals 2 or 3;
h and j are each 0,1 or 2 but j+h=1 when M is aluminum and j+h=2 when M is zirconium;
R and $R^1$ are each selected from the group consisting of alkyl groups having from 1 to 12 carbon atoms, alkenyl groups having from 2 to 12 carbon atoms, and aralkyl groups having from 7 to 12 carbon atoms; $R^2$ and $R^3$ are each hydrogen or the groups of R and $R^1$;
C,D,E,H and J are each monovalent ligands selected from the group consisting of monosubstituted amino, disubstituted amino, trisubstituted amino, alkanols having from 1 to 18 carbon atoms, aryl alcohols having from 6 to 12 carbon atoms, alkenols having from 2 to 18 carbon atoms, and ester pyrophosphates having the generic formula;

$$-OP(O)(OR^5)OP(OR^6)(OR^7)(O)$$

wherein $R^5$, $R^6$ and $R^7$ are selected from the primary group consisting of alkyl groups having from 1 to 18 carbon atoms, alkenyl groups having from 2 to 18 carbon atoms, aryl groups having from 7 to 12 carbon atoms, aralkyl groups having from 7 to 12 carbon atoms; or wherein any two of said $R^5$, $R^6$ and $R^7$ is selected from said primary group and the remainder or $R^5$, $R^6$ and $R^7$ is selected from a secondary group consisting of hydrogen, an amine having the following;

$$NR^8,R^9,R^{10},R^{11}$$

wherein $R^8$, $R^9$, $R^{10}$ and $R^{11}$ are each selected from the group consisting of hydrogen, alkyl groups having from 1 to 12 carbon atoms, alkenyl groups having from 2 to 12 carbon atoms, and aralkyl groups having from 7 to 12 carbon atoms; and a phosphate having the formula;

$$HP(OR^{12})(OR^{13})(OR^{14})$$

wherein $R^{12}$ is selected from the group consisting of hydrogen, alkyl groups having from 1 to 12 carbon atoms, alkenyl groups having from 2 to 12 carbon atoms and aralkyl groups having from 7 to 12 carbon atoms and $R^{13}$ and $R^{14}$ are each selected from the group consisting of alkyl groups having from 1 to 12 carbon atoms, alkenyl groups having from 2 to 12 carbon atoms and aralkyl groups having from 7 to 12 carbon atoms; and wherein $R^{12}$, $R^{13}$, and $R^{14}$ may be taken together to form a ring structure bonded to HP.

2. A composition of matter selected from the group consisting of a compound represented by the formula;

$$(RO)_a(R^1O)_b Ti(C)_c(D)_d(E)_e$$

a compound represented by the formula II;

$$\begin{array}{c}(O=C)_fO\\ \phantom{xxx}\diagdown\\ \phantom{xxxxx}Ti(H)_h(J)_j\\ \phantom{xxx}\diagup\\ (R^2R^3C)_g-O\end{array}$$

and mixtures of said components;
wherein
- a & b are each 0,1 or 2 but a+b must equal 1 or 2;
- f=0 or 1;
- g=1,2 or 3 but f+g equals 2 or 3;
- h and j are each 0,1 or 2 but j+h=2;
- R and $R^1$ are each selected from the group consisting of alkyl groups having from 1 to 12 carbon atoms, alkenyl groups having from 2 to 12 carbon atoms, and aralkyl groups having from 7 to 12 carbon atoms; $R^2$ and $R^3$ are each hydrogen or the groups of R and $R^1$;
- C,D,E,H and J are each monovalent ligands selected from the group consisting of monosubstituted amino, disubstituted amino, trisubstituted amino, alkanols having from 1 to 18 carbon atoms, aryl alcohols having from 6 to 12 carbon atoms, alkenols having from 2 to 18 carbon atoms, and ester pyrophosphates having the generic formula;

$$-OP(O)(OR^5)OP(OR^6)(OR^7)(O)$$

wherein $R^5$, $R^6$ and $R^7$ are selected from the primary group consisting of alkyl groups having from 1 to 18 carbon atoms, alkenyl groups having from 2 to 18 carbon atoms, aryl groups having from 7 to 12 carbon atoms, aralkyl groups having from 7 to 12 carbon atoms; or wherein any two of said $R^5$, $R^6$ and $R^7$ is selected from said primary group and the remainder of $R^5$, $R^6$ and $R^7$ is selected from a secondary group consisting of hydrogen, an amine having the formula;

$$NR^8,R^9,R^{10},R^{11}$$

wherein $R^8$, $R^9$, $R^{10}$ and $R^{11}$ are each selected from the group consisting of hydrogen, alkyl groups having from 1 to 12 carbon atoms, alkenyl groups having from 2 to 12 carbon atoms, and aralkyl groups having from 7 to 12 carbon atoms; and a phosphate having the formula;

$$HP(OR^{12})(OR^{13})(OR^{14})$$

wherein $R^{12}$ is selected from the group consisting of hydrogen, alkyl groups having from 1 to 12 carbon atoms, alkenyl groups having from 2 to 12 carbon atoms and aralkyl groups having from 7 to 12 carbon atoms and $R^{13}$ and $R^{14}$ are each selected from the group consisting of alkyl groups having from 1 to 12 carbon atoms, alkenyl groups having from 2 to 12 carbon atoms and aralkyl groups having from 7 to 12 carbon atoms; and wherein $R^{12}$, $R^{13}$, and $R^{14}$ may be taken together to form a ring structure bonded to HP.

3. A composition of matter as in claim 1 wherein M is aluminum.

4. A composition of matter as in claim 1 wherein M is zirconium.

* * * * *